(12) United States Patent
Kettern et al.

(10) Patent No.: US 10,856,431 B2
(45) Date of Patent: Dec. 1, 2020

(54) CARRIER ASSEMBLY FOR CARRYING AN ELECTRONICS HOUSING

(71) Applicant: Phoenix Contact GmbH & Co. KG, Blomberg (DE)

(72) Inventors: Markus Kettern, Lemgo (DE); Dieter Holste, Detmold (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 205 days.

(21) Appl. No.: 16/077,488

(22) PCT Filed: Jan. 31, 2017

(86) PCT No.: PCT/EP2017/052042
§ 371 (c)(1),
(2) Date: Aug. 13, 2018

(87) PCT Pub. No.: WO2017/140493
PCT Pub. Date: Aug. 24, 2017

(65) Prior Publication Data
US 2019/0053395 A1    Feb. 14, 2019

(30) Foreign Application Priority Data

Feb. 15, 2016    (DE) .................. 10 2016 102 612

(51) Int. Cl.
*H05K 7/14*        (2006.01)
*F16B 2/22*        (2006.01)

(52) U.S. Cl.
CPC ............. *H05K 7/1401* (2013.01); *F16B 2/22* (2013.01); *H05K 7/1468* (2013.01); *H05K 7/1474* (2013.01)

(58) Field of Classification Search
CPC .......... H01R 9/2458; H01R 9/26–2666; H05K 5/0021; H05K 7/1409; H05K 7/1411; H05K 7/1401; H05K 7/1468; H05K 7/1474; G06F 1/191; G06F 1/184; G06F 1/185; F16B 2/22
USPC ........ 439/716, 717; 361/726, 732, 747, 759, 361/801
See application file for complete search history.

(56) References Cited

U.S. PATENT DOCUMENTS 6,147,877 A      11/2000  Strandberg et al.
6,371,435 B1 *    4/2002  Landis ................. H02B 1/052
                                                        248/694
6,840,819 B2     1/2005  Bet et al.
9,454,140 B2 *   9/2016  Godau ................ H05K 7/1468
(Continued)

FOREIGN PATENT DOCUMENTS

DE          2027157 A1     12/1971
DE        19807710 A1      9/1999
(Continued)

*Primary Examiner* — Gary F Paumen
(74) *Attorney, Agent, or Firm* — Leydig, Voit & Mayer, Ltd.

(57) ABSTRACT

A carrier assembly for carrying an electronics housing includes: a base; a carrier element that locks to the base; a slot on which the electronics housing is put; and a locking element that is adjustably arranged on the carrier element, locks the base to the carrier element when in a locked position, and is blocked in the locked position when an electronics housing is put onto the slot such that the locking element cannot be moved out of the locked position.

9 Claims, 7 Drawing Sheets

(56) References Cited

U.S. PATENT DOCUMENTS

| | | |
|---|---|---|
| 2002/0072256 A1 | 6/2002 | Lostoski et al. |
| 2002/0072266 A1 | 6/2002 | Lange |
| 2013/0260605 A1* | 10/2013 | Kawabata ............ H01R 9/2608 439/532 |
| 2014/0156029 A1 | 6/2014 | Godau et al. |

FOREIGN PATENT DOCUMENTS

| | | |
|---|---|---|
| DE | 10036853 C2 | 2/2002 |
| DE | 10119457 C1 | 11/2002 |
| DE | 102011110182 A1 | 2/2013 |
| DE | 102014102733 A1 | 9/2015 |
| EP | 0896504 A2 | 2/1999 |
| EP | 1189307 B1 | 3/2002 |
| EP | 0909122 B1 | 3/2003 |
| JP | 10173356 A | 6/1998 |

* cited by examiner

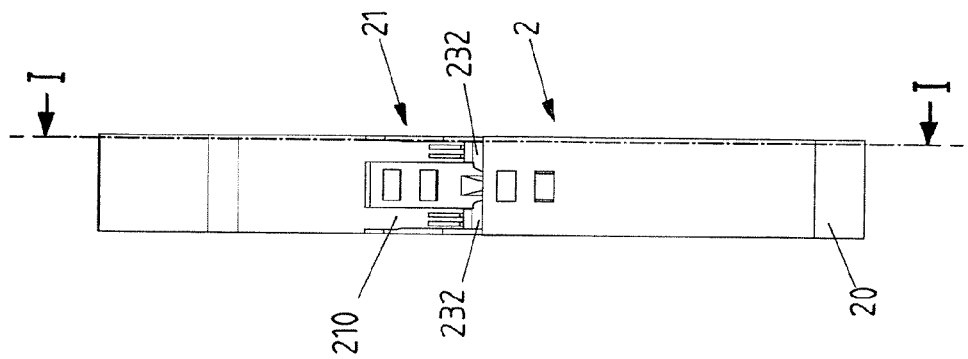
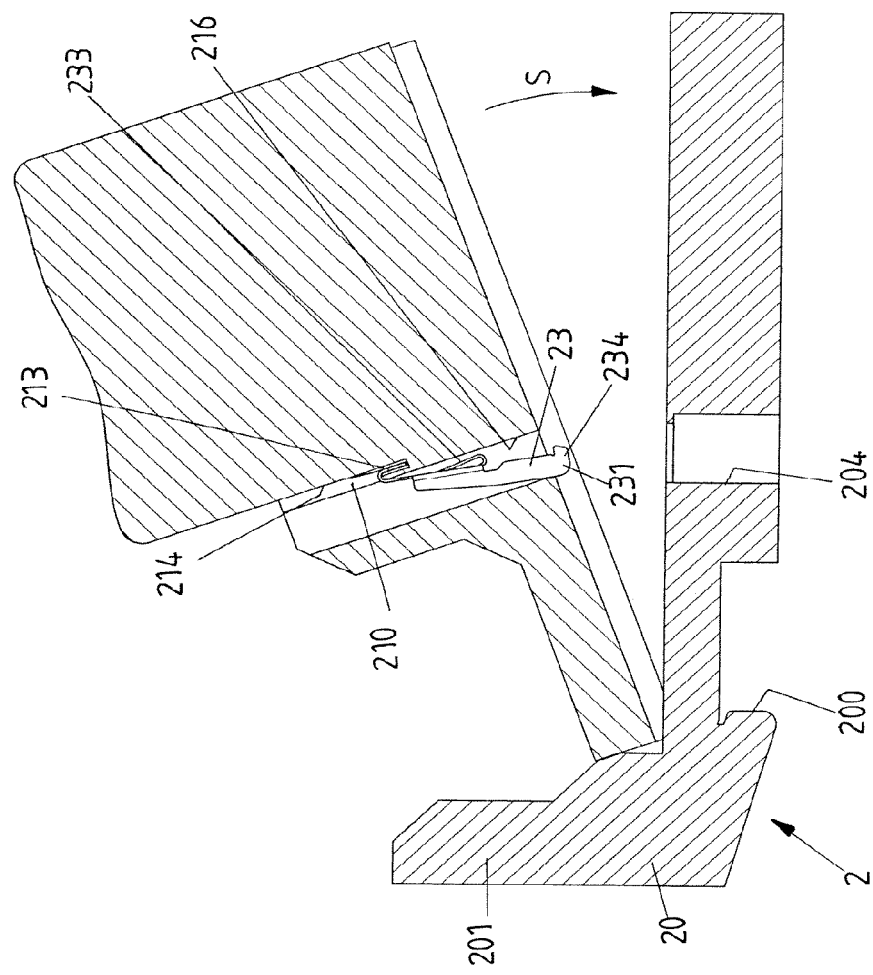

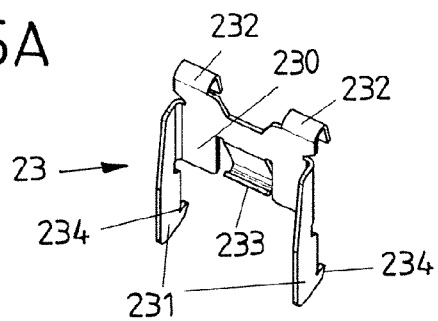
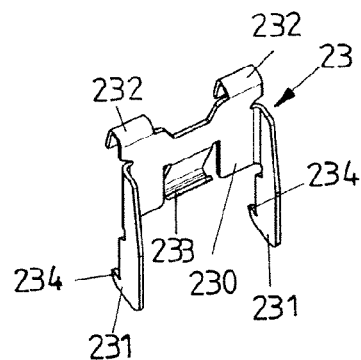
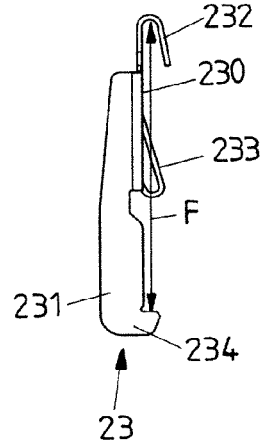
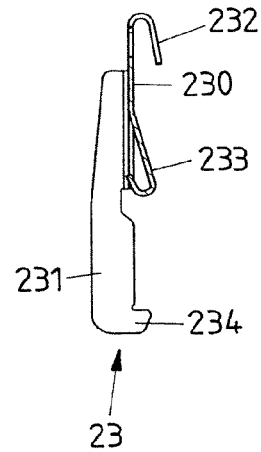
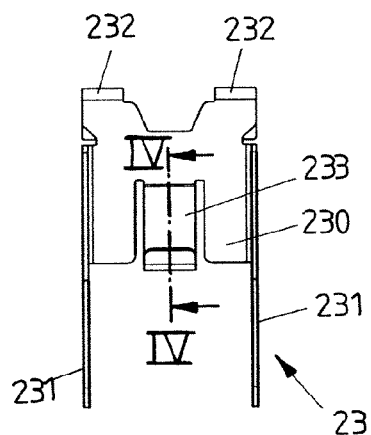
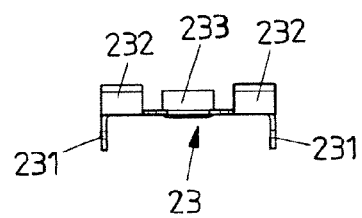

CARRIER ASSEMBLY FOR CARRYING AN ELECTRONICS HOUSING

CROSS-REFERENCE TO PRIOR APPLICATIONS

This application is a U.S. National Phase application under 35 U.S.C. § 371 of International Application No. PCT/EP2017/052042, filed on Jan. 31, 2017, and claims benefit to German Patent Application No. DE 10 2016 102 612.3, filed on Feb. 15, 2016. The International Application was published in German on Aug. 24, 2017 as WO 2017/140493 under PCT Article 21(2).

FIELD

The invention relates to a carrier assembly for carrying an electronics housing.

BACKGROUND

A carrier assembly of this kind is used for example for carrying an electronics housing that may comprise electronics. Electrical conductors for example may be intended to be connected to the electronics housing in order to provide an electrical power supply to the electronics enclosed by the electronics housing, to feed sensor signals to the electronics, or to exchange other data signals with the electronics. The electronics housing may be intended to be fixed on a DIN rail by means of the carrier assembly, the DIN rail being designed to carry a plurality of modular units that can be put side-by-side on the DIN rail, such that it is possible, using modular electronics housings, series terminals or other devices, to provide an installation that can take on for example control, evaluation or other functions.

The carrier assembly comprises a base and a carrier element that can be locked to the base. The electronics housing can be put on a slot of the carrier assembly and, when put on, is connected to the carrier assembly and held thereby on the carrier assembly.

DE 20 27 157 A1 discloses a carrier assembly that can be put on a DIN rail. A housing of an electrical installation device can be connected to the carrier assembly.

In the case of a connection device known from DE 100 36 853 C2, a housing comprises a latch spring by means of which the housing can be fixed on a mounting frame.

DE 101 19 457 C1 describes a carrier that can be arranged on a DIN rail and forms a slot for latched connection of a housing to the carrier.

EP 0 909 122 B1 discloses an electronic device to be put on a DIN rail. The electronic device comprises a housing that consists of a lower housing part that can be releasably connected to the DIN rail, and an upper housing part that can be releasably connected to the lower housing part.

U.S. Pat. No. 6,840,819 B2 describes a carrier assembly that forms a slot on which an electronics housing is put. The carrier assembly can be arranged on a DIN rail in order to thus hold the electronics housing on the DIN rail.

SUMMARY

In an embodiment, the present invention provides a carrier assembly for carrying an electronics housing, comprising: a base; a carrier element configured to be locked to the base; a slot configured to receive the electronics housing; and a locking element that is adjustably arranged on the carrier element, configured to lock the base to the carrier element when in a locked position, and is blocked in the locked position when the electronics housing is in the slot such that the locking element cannot be moved out of the locked position.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 2A is an end view of the carrier assembly when a carrier element is being put onto a base of the carrier assembly;

FIG. 2B is a sectional view along the line I-I according to FIG. 2A;

FIG. 3A is an end view of the carrier assembly when an electronics housing is being put on;

FIG. 4A is an end view of the carrier assembly when the electronics housing has been put on;

FIG. 5A, 5B are views of a locking element for locking the carrier element to the base;

FIG. 6A is a front view of the locking element;

FIG. 6B is a sectional view along the line IV-IV according to FIG. 6A;

FIG. 6C is a side view of the locking element; and

FIG. 6D is a plan view of the locking element.

DETAILED DESCRIPTION

Figure 1:
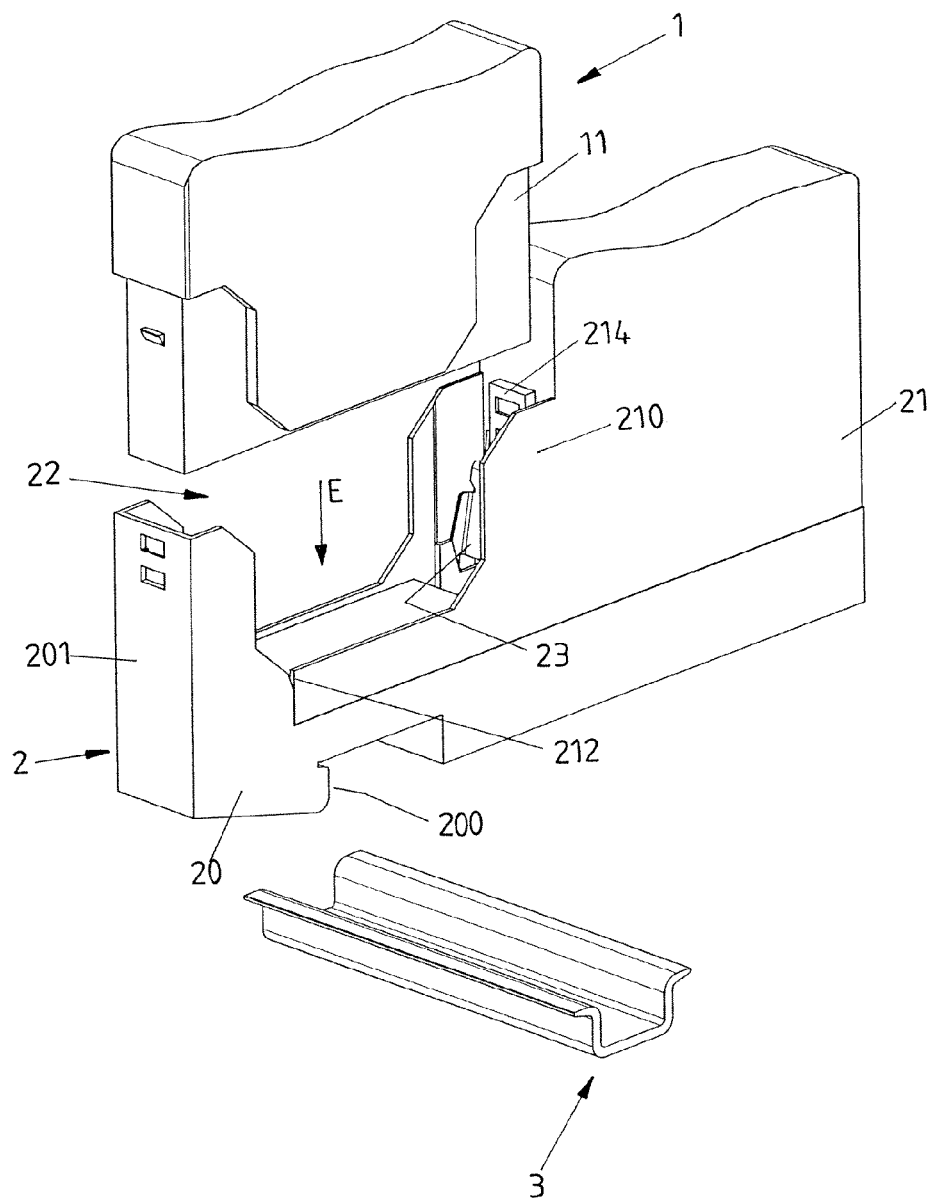
FIG. 1 is a perspective view of a carrier assembly on which an electronics housing can be put.

According thereto, the carrier assembly comprises a locking element that is adjustably arranged on the carrier element and that locks the base to the carrier element when in a locked position and is blocked in the locked position, when an electronics housing is put on the slot, such that the locking element cannot be moved out of the locked position.

The locking element provided establishes rigid locking between the carrier element and the base, which locking may be designed so as to be able to rigidly and reliably carry even large electronics housings. In the locked position thereof, the locking element locks the base to the carrier element. For this purpose, the locking element can be moved between an unlocked position and a locked position, and is blocked in the locked position when an electronics housing is put on the slot formed by the carrier assembly.

Since the locking element is blocked in the locked position thereof when an electronics housing is put on the slot of the carrier assembly, the locking between the base and the carrier element cannot be released when an electronics housing is located on the carrier assembly. When an electronics housing is put on, the base is thus rigidly and reliably connected to the carrier element. Only after the electronics housing has been removed can the locking between the base and the carrier element be released, such that the carrier element can be separated from the base.

Since a two-part carrier assembly is provided, comprising a base and a carrier element that are to be releasably interconnected, it is possible to interconnect different bases and carrier elements in a modular manner. For example, a uniform base may be provided for fixing the carrier assembly on a DIN rail. The base can be connected to different carrier elements that allow different electronics housings to be put onto the carrier assembly.

In this case, the locking element locks the carrier element to the base when an electronics housing is put on the carrier assembly. When an electronics housing is put on the carrier assembly, a rigid connection is thus created between the electronics housing, the carrier element and the base, in that the electronics housing is latched in the slot for example and the carrier element is locked to the base.

The locking element is preferably designed so as to adjust itself from the unlocked position and into the locked position when the electronics housing is put on the slot. If the electronics housing is put on the slot, the electronics housing acts on the locking element and adjusts the locking element from the unlocked position and into the locked position, such that the locking between the carrier element and the base is established automatically when the electronics housing is put on. If the electronics housing is inserted into the slot, the locking element is held in the locked position and thus blocked in the locked position, such that the locking between the carrier element and the base cannot be released.

In an advantageous embodiment, the locking element is spring pre-loaded, relative to the carrier element, towards the unlocked position. The transfer of the locking element into the locked position thus takes place counter to the spring pre-loading. If the electronics housing is then released from the carrier assembly again, the locking element returns automatically into the unlocked position, due to spring pre-loading, such that the locking is automatically released when the electronics housing is removed and the carrier element can thus be released from the base.

In one embodiment, the locking element is pivotally held on the carrier element. In order to transfer the locking element between the unlocked position and the locked position, the locking element can thus be pivoted relative to the carrier element.

It should be noted in this regard that other embodiments are in principle also conceivable and possible. In particular, the locking element may for example also be slidably arranged on the carrier element and be moved between the unlocked position and the locked position by means of sliding.

In order to fix the locking element on the carrier element, the locking element may for example comprise a fastening element at a first end, which fastening element may be hook-shaped for example. The locking element can for example be suspended in an associated fastening means on the carrier element by means of the fastening element, such that the locking element is pivotally held on the carrier element. At a second end remote from the first end the locking element comprises an element that, in contrast to the first end, is interlocking and is intended for engagement with an associated latching element of the base. The interlocking element establishes the locking between the carrier element and the base in that the interlocking element, which can be formed in the manner of an undercut, engages behind an associated latching element of the base for the purpose of locking, and thus fixes the carrier element on the base in an interlocking manner. In this case, the flux of force extends between the fastening element on the first end of the locking element, and the interlocking element on the second end of the locking element. This flux of force introduces forces from the carrier element into the base, and via this for example into a DIN rail on which the base is arranged.

In one embodiment, the locking element comprises a foundation that extends along an extension plane, and at least one leg that extends on the foundation and protrudes from the foundation transversely to the extension plane, and on which the at least one interlocking element for engaging in an associated latching element of the base is arranged. The at least one fastening element, for example, is arranged on the foundation, while the at least one leg carries the at least one interlocking element. Since the leg or legs protrude(s) transversely from the foundation, the strength of the locking element, which element may for example be manufactured as a sheet metal part from spring steel, is structurally reinforced.

A spring leg may be arranged on the locking element, such that the spring leg protrudes from the foundation and comes into contact, in a pre-loading manner, with the carrier element when the locking element is transferred into the locked position. Said spring leg can provide spring pre-loading that pre-loads the locking element towards the unlocked position.

In a specific embodiment, for example two fastening elements transversely offset from one another, and two legs transversely offset from one another, each having an interlocking element arranged thereon, may be formed on the foundation. The legs extend for example laterally along the foundation and protrude from the foundation transversely to the extension plane. An interlocking element is formed on each leg.

The locking element is for example integral, and is produced from a spring steel for example.

In one embodiment, the locking element passes through a first opening of the carrier element for example, and engages in a second opening of the base. The locking element for example rests in the first opening of the carrier element and is adjustable in said opening. When the carrier element is put on the base, the locking element engages with the second opening of the base and establishes an interlocking connection between the carrier element and the base when transferred into the locked position.

In order to rigidly and reliably connect the carrier element to the base, a plurality of locking devices may be provided. Thus, at least one further locking device is preferably provided in addition to the locking element, which locking device connects the carrier element to the base at another point. For example, the carrier element can thus be intended to be locked to the base at two mutually offset points (with respect to a longitudinal extension direction of the carrier element and of the base, transversely to an insertion direction in which the electronics housing is to be inserted into the slot, and transversely to a longitudinal direction of a DIN rail on which the base is to be put), it also being conceivable and possible in principle to provide locking at more than two, for example at three, points.

An advantageous module comprises a carrier assembly according to the type described above, and an electronics housing that can be inserted into the slot formed by the carrier assembly. If the electronics housing is put on the carrier assembly, the locking element creates a rigid connection between the base and the carrier element, such that the electronics housing can be held on the base in a rigid, reliable and resilient manner by means of the carrier element.

FIG. 1 is a view of a carrier assembly 2 that comprises a base 20 and a carrier element 21 put thereon and that can be put on a DIN rail 3 by means of a fastening point 200 on the base 20 and also forms a slot 22 for receiving an electronics housing 1.

A carrier assembly 2 of this kind is used for arranging an electronics housing 1 on a DIN rail 3. As a result, a plurality of carrier assemblies 2 comprising electronics housings 1 can be inserted on the DIN rail 3 in a modular manner, such that an electrical installation can be created on the DIN rail 3, optionally in conjunction with other components such as series terminals or the like, which installation can take on for example control, evaluation or distribution functions or the like.

The carrier assembly 2 comprising the base 20 and the carrier element 21 is formed in two parts. In this case, the base 20 and the carrier element 21 each also comprise a guide element 201, 210 which together form the slot 22 and between which the electronics housing 1 can be plugged in in an insertion direction E. For this purpose, two plug-in regions 10, 11 are formed on the electronics housing 1, by means of which regions the electronics housing 1 can be plugged in between the guide elements 201, 210. When the electronics housing 1 is put on, the guide elements 201, 210 can latch onto the electronics housing 1 in order to connect the electronics housing 1 to the carrier assembly 2.

Outside of the slot 22, the carrier element 21 for example comprises an array of insertion openings, into each of which an electrical conductor can be inserted in order to thus electrically contact electrical conductors of the carrier assembly 1. In addition, an electrical plug-in connector may be formed on the slot 22, which connector comes into plugged engagement with the electronics housing 1 when the electronics housing 1 is put onto the slot 22, and thus establishes electrical contacting between the carrier assembly 2 and the electronics housing 1. Electrical signals can thus be exchanged between the terminal devices 215 and the electrical conductors connected thereto, and electronics enclosed in the electronics housing 1, by means of a plug-in connector part of this kind.

The carrier element 21 is put releasably on the base 20, it also being conceivable and possible to connect different carrier elements 21 to the base 20 in a modular manner in order to adapt the carrier assembly 2 for receiving different electronics housings 1.

Figure 3A:
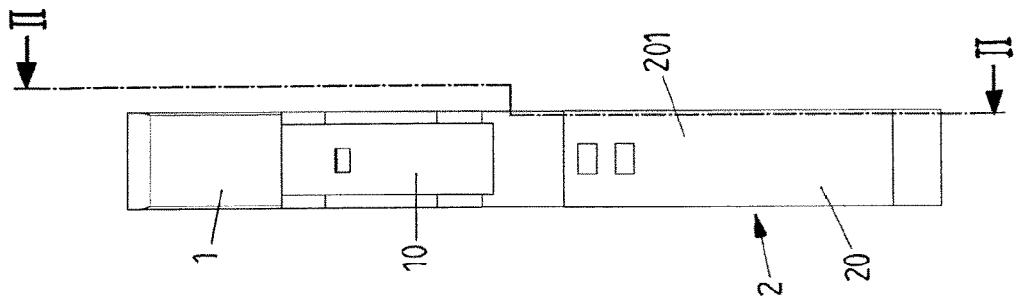
Figure 3B:
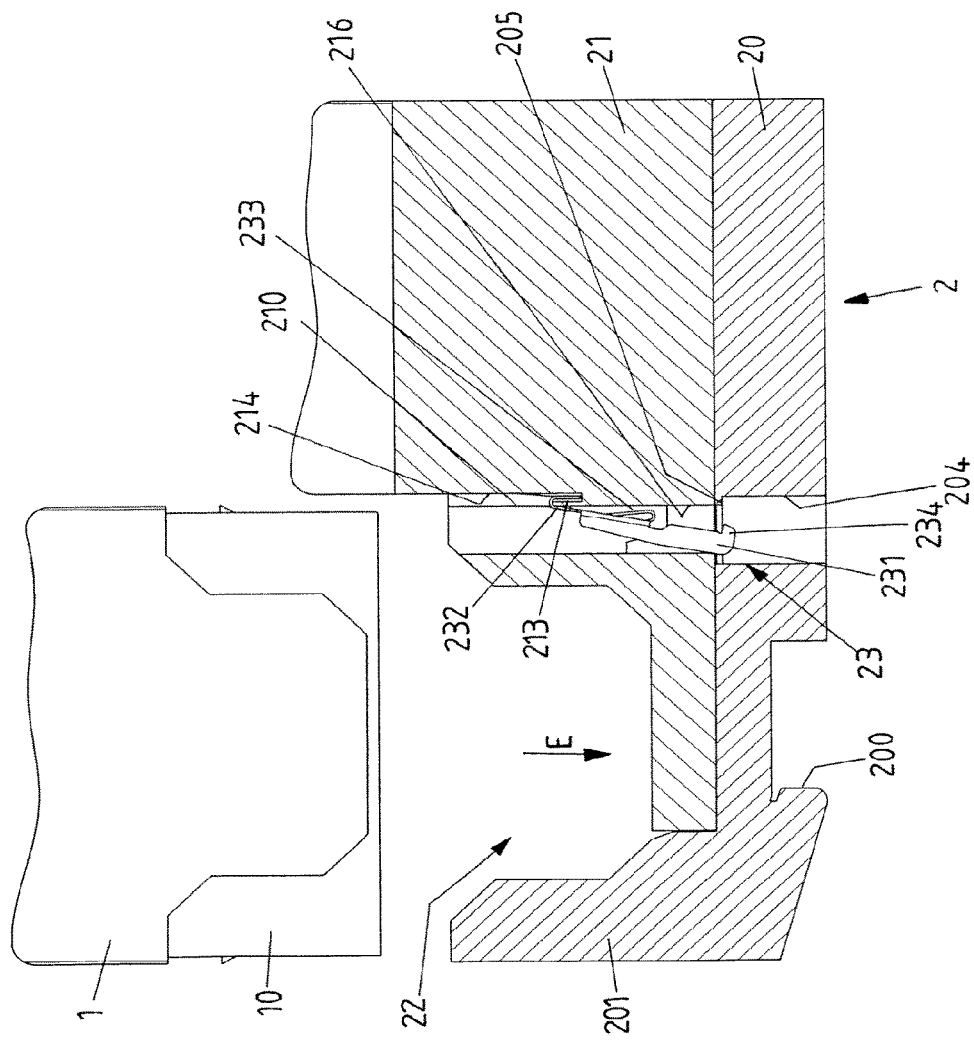
FIG. 3B is a sectional view along the line II-II according to FIG. 3A.
Figure 3C:
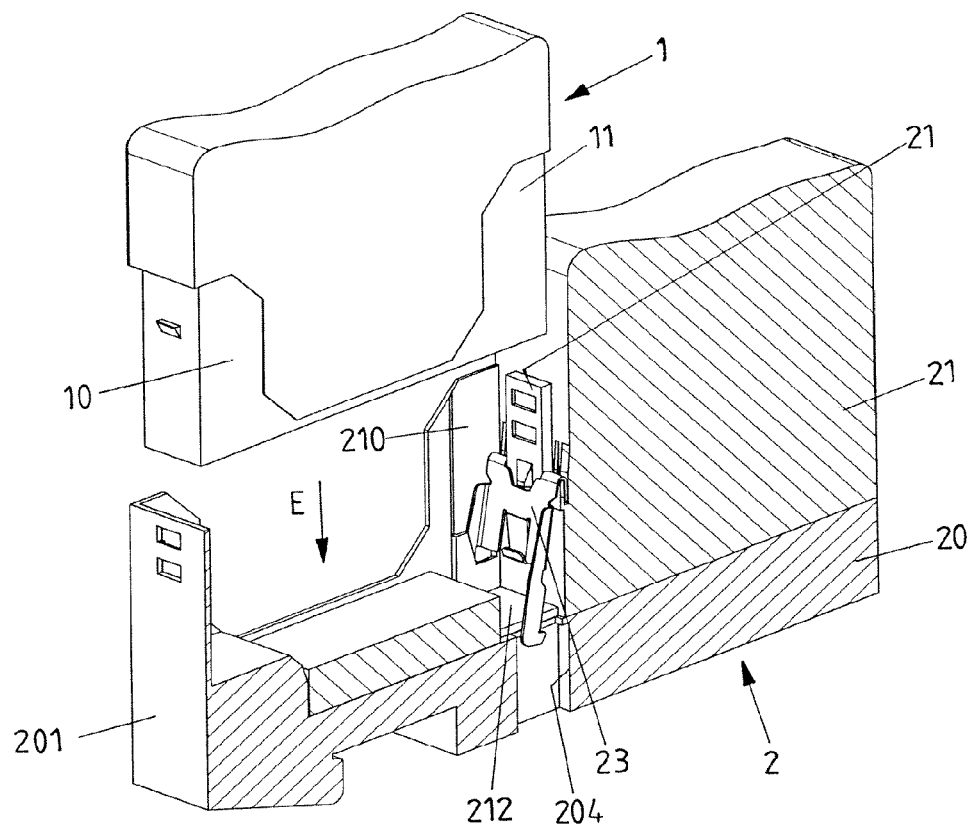
FIG. 3C is a perspective view of the module.
Figure 4A:
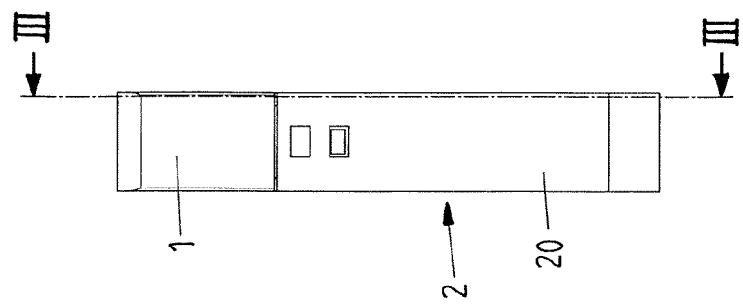
Figure 4B:
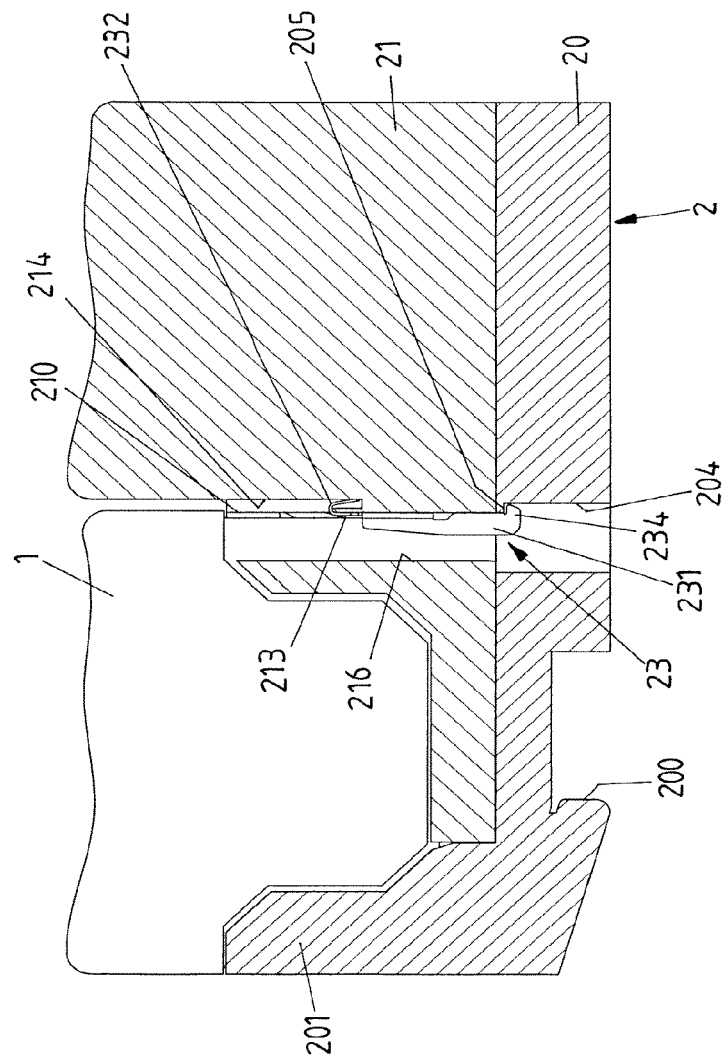
FIG. 4B is a sectional view along the line according to FIG. 4A.
Figure 4C:
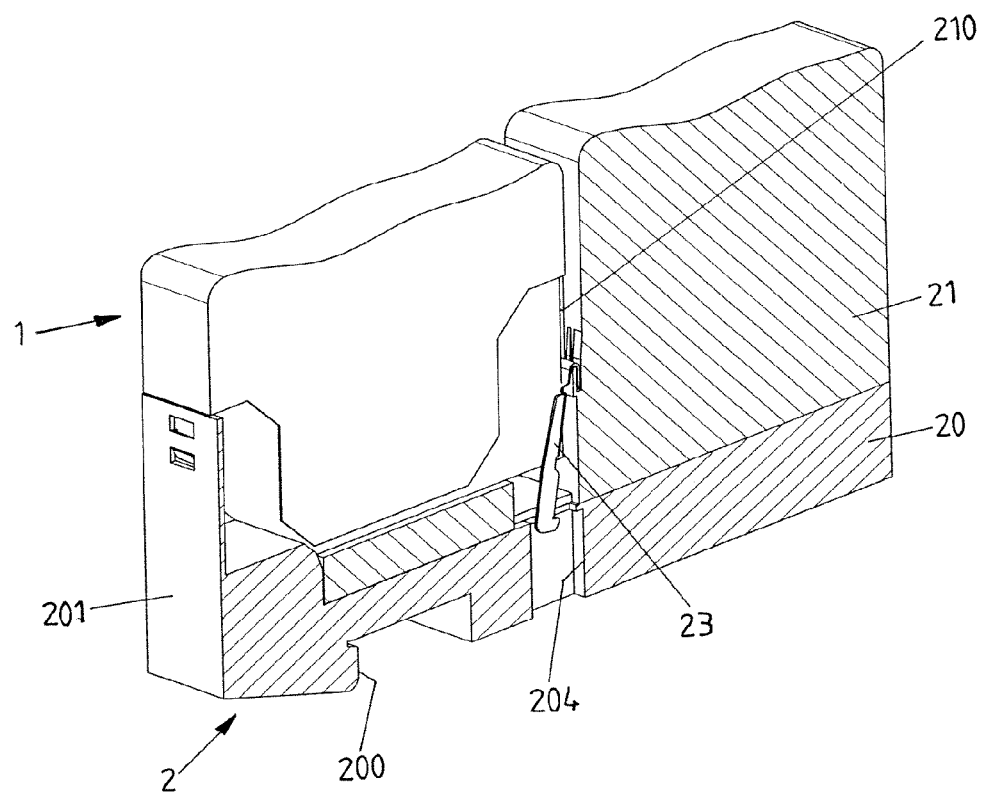
FIG. 4C is a perspective view of the module.

FIGS. 2A, 2B, 3A-3C and 4A-4C show the carrier assembly 2 together with the electronics housing 1 in different positions when the carrier element 21 is joined to the base 20 (FIGS. 2A and 2B), when the electronics housing 1 is being put on (3A to 3C), and in the position in which the electronics housing 1 has been put on (FIG. 4A to 4C). FIGS. 5A, 5B and 6A to 6D are separate views of the locking element 23.

In order to put the carrier element 21 onto the base 20, as can be seen in the sectional view according to FIG. 2B, one end of the carrier element 21 is put on the base 20 and the carrier element 21 is pivoted towards the base 20 in a pivoting direction S. Fastening elements 232 of the locking element 23, in the form of hooks on a foundation 230 (see FIGS. 5A and 5B), are put onto an associated fastening means 213 in the form of projections on the carrier element 21 and are thus held on the carrier element 21 such that the locking element 23 rests in an opening 216 of the carrier element 21.

As can be seen in FIGS. 5A, 5B and 6A to 6D, the locking element 23 comprises two hook-shaped fastening elements 232 by means of which the locking element 23 is put onto a base side 214 of the guide element 210 of the carrier element 21, which guide element is U-shaped in cross section, the fastening elements 232 of the locking element 23 each clasping an associated projection on the base side 214 of the guide element 210 for this purpose. In the position according to FIG. 2B, when the carrier element 21 is put onto the base 20, the locking element 23 is in an oblique position in the opening 216 and can be brought into engagement with an opening 204 on the base 20, as can be seen in the sectional view according to FIG. 3B for example, by means of the carrier element 21 being pivoted towards the base 20 in the pivoting direction S.

If the carrier element 21 has been put onto the base 20, an electronics housing 1 can thus be plugged into the associated slot 22, between the guide elements 201, 210, as is shown in FIG. 3A to 3C. For this purpose, the plug-in regions 10, 11 of the electronics housing 1 are brought into engagement with the guide elements 101, 210 until the electronics housing 1 is latched to the carrier assembly 2.

When the electronics housing 1 is put onto the carrier assembly 2, the plug-in region 11 of the electronics housing 1 that is associated with the guide element 210 of the carrier element 21 strikes the locking element 23 and pivots said element about the fastening elements 232 such that hook-like interlocking elements 234 on legs 231 of the locking element 23 come into engagement with a latching element 205, in the form of a latching edge, on the base 20, as can be seen in the sectional view according to FIG. 4B.

As can be seen in the detailed views according to FIGS. 5A, 5B and 6A to 6D, the legs 231 extend laterally on the foundation 230 of the locking element 23 and protrude from the foundation 230 transversely to the planar extension plane thereof. At the ends remote from the fastening elements 232, the legs 131 carry the interlocking elements 234, by means of which an interlocking connection is established between the carrier element 21 and the base 20 when the locking element 23 is pivoted into engagement with the latching edge 205 on the base 20.

In the initial example shown, the locking element 23 is manufactured integrally, for example as a sheet metal part made of spring steel. Since the legs 231 extend laterally on the foundation 230 and protrude from the foundation 230 transversely to the extension plane, a dimensionally stable component is provided that can establish reliable, resilient locking between the carrier element 21 and the base 20.

In the locked position, a flow of flux F (see FIG. 6C) exists between the fastening elements 232 and the interlocking elements 234 on the legs 231. This flow of flux F can conduct away forces from the carrier element 21 into the base 20 and therefrom into the DIN rail 3, such that a resilient connection is created between the electronics housing 1, the carrier element 21 and the base 20.

If the electronics housing 1 is put onto the carrier assembly 2, the electronics housing 1 thus holds the locking element 23 in the locked position thereof (see FIG. 4B). The locking element 23 is thus blocked in the locked position when the electronics housing 1 is put onto the carrier assembly 2, such that the locking between the carrier element 21 and the base 20 cannot be released easily, at least not without removing the electronics housing 1, when the electronics housing 1 has been put on.

When the locking element 23 is transferred into the locked position thereof, a spring leg 233 of the locking element 23 that protrudes from the foundation 230 comes into contact with the carrier element 21. When the locking element 23 is transferred into the locked position, said spring leg 133 is tensioned and thus provides spring pre-loading between the locking element 23 and the carrier element 21, towards the unlocked position of the locking element 23.

The result of this is that, when the electronics housing 1 is removed from the slot 22, the locking element 23 automatically pivots back into the unlocked position thereof and the locking between the carrier element 21 and the base 20 is thus released. Therefore, if the electronics housing 1 is removed from the slot 22, the carrier element 21 and the base 20 can be separated from one another.

As can be seen in the detailed views according to FIGS. 5A, 5B and 6A to 6D, both the fastening elements 232 and the interlocking elements 234 are offset from one another transversely to the insertion direction E and transversely to the longitudinal extension direction of the base 20 and of the carrier element 21.

The basic concept of the invention is not limited to the embodiments described above, but can in principle also be implemented in a completely different manner.

A carrier assembly of the type described here is suitable in principle for carrying very different electronics housings and in this respect is not limited to the embodiment described.

In principle, locking can also be established between the carrier element and the base at more than two locations in the longitudinal extension direction of the base and of the carrier element in order to thus provide a highly resilient connection between the carrier element and the base.

A module of a carrier assembly of this kind and an electronics housing has many possible uses. In particular, the electronics housing may enclose electronics that can take on control, evaluation or other functions.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 1 electronics housing
10, 11 plug-in region
2 carrier assembly
20 base
200 fastening point
201 guide element
204 engagement opening
205 latching element (latching edge)
21 carrier element
210 guide element
213 projection
214 base side
216 opening
22 slot
23 locking element
230 foundation
231 leg
232 fastening element (hook)
233 spring leg
234 interlocking element (hook element)
3 DIN rail
E insertion direction
F flux of force
S pivoting direction

The invention claimed is:

1. A carrier assembly for carrying an electronics housing, comprising:
   a base;
   a carrier element configured to be locked to the base;
   a slot configured to receive the electronics housing; and
   a locking element that is adjustably arranged on the carrier element, configured to lock the base to the carrier element when in a locked position, and is blocked in the locked position when the electronics housing is in the slot such that the locking element cannot be moved out of the locked position,
   wherein a first end of the locking element comprises at least one fastening element by which the locking element is configured to be adjustably fastened to the carrier element, and a second end of the carrier assembly that is remote from the first end comprises at least one interlocking element configured for engagement with an associated latching element of the base.

2. The carrier assembly according to claim 1, wherein the locking element is configured to adjust itself from an unlocked position, in which the locking element does not lock the base to the carrier element, and into the locked position, when the electronics housing is in the slot.

3. The carrier assembly according to claim 2, wherein the locking element is spring pre-loaded, relative to the carrier element, towards the unlocked position.

4. The carrier assembly according to claim 1, wherein the locking element is pivotally held on the carrier element.

5. The carrier assembly according to claim 1, wherein the locking element comprises a foundation that extends along an extension plane, and at least one leg that extends on the foundation and protrudes from the foundation transversely to the extension plane, and on which the at least one interlocking element is arranged.

6. The carrier assembly according to claim 5, wherein the locking element comprises a spring leg arranged on the foundation, which spring leg is configured to pre-load loading the locking element relative to the carrier element.

7. The carrier assembly according to claim 1, wherein the locking element comprises two fastening elements that are transversely offset from one another, and two legs that are transversely offset from one another, each having an interlocking element arranged thereon.

8. The carrier assembly according to claim 1, wherein the locking element passes through a first opening of the carrier element and engages in a second opening of the base.

9. A module, comprising:
the carrier assembly according to claim 1; and
an electronics housing configured to be received in the slot of the carrier assembly.

\* \* \* \* \*